(12) United States Patent
Kanazawa et al.

(10) Patent No.: US 7,518,132 B2
(45) Date of Patent: Apr. 14, 2009

(54) LIGHT SOURCE APPARATUS, EXPOSURE APPARATUS AND DEVICE FABRICATION METHOD

(75) Inventors: Hajime Kanazawa, Utsunomiya (JP); Yutaka Watanabe, Shioya-gun (JP); Jun Ito, Utsunomiya (JP); Kazuki Fujimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 319 days.

(21) Appl. No.: 11/456,104

(22) Filed: Jul. 7, 2006

(65) Prior Publication Data

US 2007/0023709 A1    Feb. 1, 2007

(30) Foreign Application Priority Data

Jul. 8, 2005    (JP)    ............................. 2005-200764

(51) Int. Cl.
    *H01J 35/20*    (2006.01)
(52) U.S. Cl. ................................. 250/504 R; 250/492.2

(58) Field of Classification Search ............. 250/504 R, 250/492.2; 378/119
See application file for complete search history.

(56) References Cited

U.S. PATENT DOCUMENTS

| 5,763,930 A * | 6/1998 | Partlo ..................... 250/504 R |
| 6,753,941 B2 * | 6/2004 | Visser ......................... 355/30 |
| 6,835,944 B2 * | 12/2004 | Orsini et al. ............ 250/504 R |

FOREIGN PATENT DOCUMENTS

| JP | 2002-174700 | 6/2002 |
| JP | 2003-77698 | 3/2003 |

* cited by examiner

*Primary Examiner*—Jack I Berman
(74) *Attorney, Agent, or Firm*—Locke Lord Bissell & Liddell LLP

(57) ABSTRACT

A light source apparatus for generating a plasma and supplying a light irradiated from the plasma to an optical system, said light source apparatus includes a chamber for accommodating a region that generates the plasma, wherein a density of a hydrocarbon compound included in a gas in the chamber is 300 ppb or less.

11 Claims, 5 Drawing Sheets

LIGHT SOURCE APPARATUS, EXPOSURE APPARATUS AND DEVICE FABRICATION METHOD

BACKGROUND OF THE INVENTION

The present invention relates generally to an exposure apparatus, and more particularly to a light source apparatus used in an exposure apparatus for exposing an plate, such as a single crystal substrate of a semiconductor wafer etc. and a glass plate for a liquid crystal display ("LCD"). The present invention is suitable, for example, for an exposure apparatus that uses an extreme ultraviolet ("EUV") light as a light source for exposure.

A reduction projection optical system using an EUV light as an exposure light (referred to as an "EUV exposure apparatus" hereinafter) has been developed to manufacture a fine semiconductor device that has very fine circuit pattern of 0.1 µm or less. The EUV light is a light with a wavelength of 10 nm to 15 nm shorter than that of an ultraviolet light.

The EUV exposure apparatus typically uses a laser plasma light source and a discharge plasma light source as the light source. See, for example, Japanese Patent Applications, Publication Nos. 2002-174700 and 2003-077698. The laser plasma light source irradiates a laser beam to a target material to generate a plasma and generates the EUV light. The discharge plasma light source generates a plasma by introducing gas to an electrode for discharging and generates the EUV light. The EUV light from the plasma is condensed at a condensing point, diverges from the condensing point, and enters a subsequent illumination optical system via an opening formed between the light source and the illumination optical system.

However, a material necessary for an emission, i.e., the target material or discharge gas, is supplied to a light source chamber that accommodates the plasma (an emission part). Therefore, an impurity included in those materials flows into the light source chamber. A hydrocarbon included in the impurity adheres a carbon as a contaminant to a part irradiated by the EUV light, and reduces a reflectance of an optical element, such as a condensing mirror.

Moreover, it is preferably to provide a window material that functions as a vacuum partition at the opening (connecting part) between the light source and the illumination optical system. However, a material that penetrates the EUV light or a material that can fully resist a heat load by the EUV light of power necessary for exposure does not exist. Therefore, the hydrocarbon included in the material necessary for the emission flows into a chamber that accommodates the illumination optical system and a projection optical system via the opening, adheres the carbon to an optical element in the illumination optical system and the projection optical system, and reduces the reflectance. Moreover, a light intensity on a target surface to be illuminated becomes non-uniformly according to an adhesion state of the carbon to the optical element. As a result, a decrease of throughput and resolution is caused.

BRIEF SUMMARY OF THE INVENTION

Accordingly, the present invention is directed to a light source apparatus that can reduce a contamination of an optical element in a subsequent optical system.

A light source apparatus of one aspect of the present invention for generating a plasma and supplying a light irradiated from the plasma to an optical system, said light source apparatus includes a chamber for accommodating a region that generates the plasma, wherein a density of a hydrocarbon compound included in a gas in the chamber is 300 ppb or less.

A light source apparatus according to another aspect of the present invention for generating a plasma and supplying a light irradiated from the plasma to an optical system, said light source apparatus includes a supplier for supplying a material to generate the plasma, wherein a density of a hydrocarbon compound included in a material supplied to generate the plasma is 300 ppb or less.

A light source apparatus according to still another aspect of the present invention for generating a plasma and supplying a light irradiated from the plasma to an optical system, said light source apparatus includes a first supply pipe for supplying a material to generate the plasma, and a first filter, provided to the first supply pipe, for improving a purity of the material.

An exposure apparatus according to still another aspect of the present invention includes the above light source apparatus, an illumination system for illuminating a pattern of a mask using a light from the light source, and a projection system for projecting the pattern onto a plate.

A device fabricating method according to still another aspect of the present invention includes the steps of exposing a plate using the above exposure apparatus, and performing a development process for the plate exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
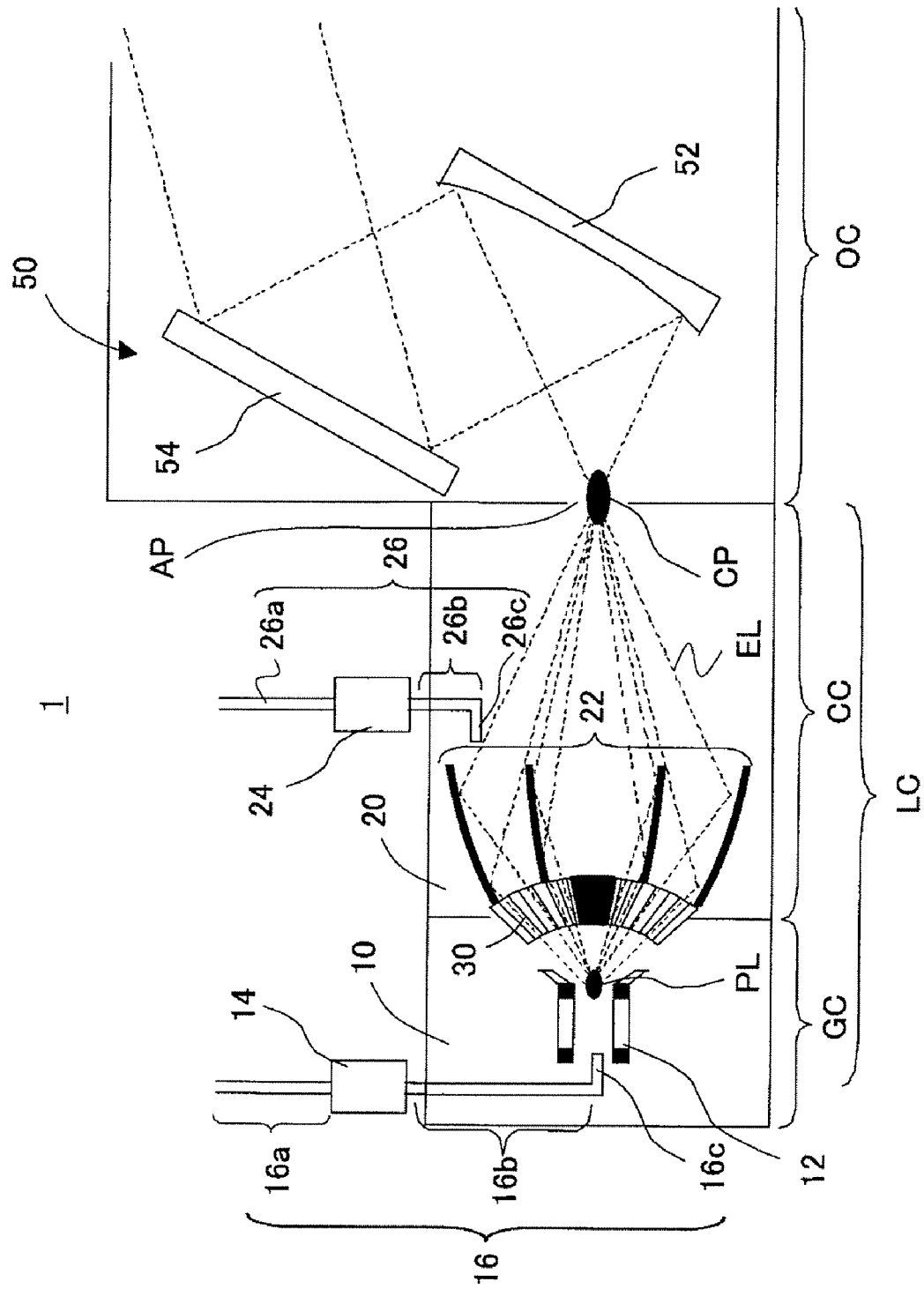
FIG. 1 is a schematic sectional view of a light source apparatus of one aspect according to the present invention.

With reference to the accompanying drawings, a description will be given of a light source apparatus of one aspect according to the present invention. In each figure, the same reference numeral denotes the same element. Therefore, duplicate descriptions will be omitted. Here, FIG. 1 is a schematic sectional view of a light source apparatus 1 of the present invention.

The light source apparatus 1 is a light source apparatus that generates a plasma PL and supplies an EUV light EL irradiated from the plasma PL (a light with a wavelength of 20 nm or less, preferably, a light with a wavelength of 13 nm or more and 15 nm or less) to a subsequent optical system 50. The light source apparatus 1 is, in the instant embodiment, a discharge plasma light source. However, the light source apparatus 1 is not limited to the discharge plasma light source and may be a laser plasma light source or a light source of other method.

The light source apparatus 1 includes an electrode 12, a first purity improving part 14, a plasma generating part 10 that has a first supply pipe 16, a condensing mirror 22, a second purity improving part 24, and a condensing part 20 that has a second supply pipe 26. The EUV light has a property that is absorbed by gas. Therefore, the prasma generating part 10 is provided in a generating chamber GC and the condensing part 20 is provided in a condensing chamber CC to prevent the absorption. The generating chamber GC and the condensing chamber CC are exhausted by vacuum pumping system (not shown) and maintain a predetermined degree of vacuum. The generating chamber GC and the condensing chamber CC constitute a light source chamber LC in the instant embodiment.

The plasma generating part 10 discharges a plasma generating gas (in the instant embodiment, Xenon (Xe) gas) supplied from the first supply pipe 16 described later to generate the plasma PL by high voltage impressed to the electrode 12. The plasma PL with high density is generated by a pinch action based on a self-magnetic field of a charged particle flow, and the EUV light EL is irradiated from the plasma PL.

The Xe gas as the plasma generating gas is supplied to the generating chamber GC via the first purity improving part 14 and the first supply pipe 15 from a Xe tank (not shown) as a supply source.

A density of a hydrocarbon compound in the light source chamber LC (the generating chamber GC and condensing chamber CC etc.) is 300 ppb or less and preferably 30 ppb or less. Particularly, a density of a hydrocarbon compound in the condensing chamber CC is 300 ppb or less and preferably 30 ppb or less. Therefore, the first purity improving part 14 improves a purity of the Xe gas, removes the hydrocarbon compound included in the Xe gas and reduce the density of the hydrocarbon compound in the Xe gas to 300 ppb or less, preferably 30 ppb or less.

Although the supply pipe (supply system) of the Xe gas is considered as the main supply source of the hydrocarbon compound in the instant embodiment, it is considered that the material basically included in the light source chamber becomes the supply source of the hydrocarbon compound. In this case, a density of the hydrocarbon in the gas supplied from the supply pipe of the Xe gas preferably becomes a density lower than 300 ppb, for example, 200 ppb or less, further preferably, 20 ppb or less.

The first purity improving part 14 uses, in the present embodiment, a gas filter that is constituted of an activated carbon that absorbs the few hydrocarbon compound included in the plasma generating gas as the impurity. Thereby, the density of the hydrocarbon compound included in the plasma generating gas that passes through the activated carbon becomes about $1/100$ to $1/1000$ of the density of the hydrocarbon compound in the Xe tank as the supply source. However, the first purity improving part 14 is not limited to the gas filter that is constituted of the activated carbon and may be filters, such as a porous metal and a cold trap that have an absorption function to the hydrocarbon compound.

In the instant embodiment (in other embodiments), a means to reduce an amount of the hydrocarbon compound that reaches the mirror in the subsequent optical system among the hydrocarbon compound in the light source chamber may be installed. The means is, for example, a member that absorbs the hydrocarbon compound (the above cold trap) in the light source chamber or a member that improves a purity of the Xe gas in the light source chamber (combination of a gas circulating system and a filter that absorbs the hydrocarbon compound etc.) etc.

When the first supply pipe 16 is long, the density of the hydrocarbon compound of the plasma generating gas easily increases by a desorption of the impurity from an inner wall of the pipe etc. Therefore, the first purity improving part 14 is provided near the generating chamber GC (in other words, near a supply port 16c of the first supply pipe 16) that is supplied the plasma generating gas and the influence is preferably reduced as much as possible.

The first supply pipe 16 supplies the Xe gas (plasma generating gas) from the Xe tank (not shown) to the generating chamber GC via the supply port 16c. The first supply pipe 16 consists of a metal (in the instant embodiment, a stainless steel) to prevent the desorption of the impurity from the inner wall. The first supply pipe 16 is preferably given a baking and vacuum-exhausted a predetermined time to remove a residual gas.

The first supply pipe 16 consists of the metal such as the stainless steel irrespective of an inside and outside of the generating chamber GC because when a resin such as a Teflon tube that has free form is used as a pipe material, the desorption of the hydrocarbon compound from the inner wall remarkably increases. Particularly, the first supply pipe 16 between the first purity improving part 14 and the supply port 16c needs to consist of the metal because the first purity improving part 14 cannot remove the desorption hydrocarbon from the inner wall.

Moreover, an impurity removal effect of the first purity improving part 14 has a life and the life becomes short if a gas with bad purity is used. Therefore, the first supply pipe 16a between the Xe tank as the supply source and the first purity improving part 14 preferably consists of the metal.

In the condensing part 20, the EUV light EL from the plasma PL pass through a debris filter 30 that removes a debris particle, is reflected by the condensing mirror 22 that constitutes two couples of mirrors with a spheroid as a reflective surface, and condenses at a condensing point CP. The condensing mirror 22 uses a grazing incidence type mirror in the instant embodiment, but is not limited to this. For example, the condensing mirror 22 may uses a normal incidence type mirror that has a multilayer film.

The debris filter 30 is provided between the generating chamber GC described later and the condensing chamber CC in the instant embodiment. The debris filter 30 catches the debris that generates from the plasma PL or members near the plasma PL and is intercepted rectilinear propagation by a buffer gas (in the instant embodiment, an argon (Ar) gas) supplied from the second supply pipe 26 described later. In other words, the debris filter 30 reduces an amount of the debris and prevents an adhesion of the debris to the condensing mirror 22 or the optical system 50.

The Ar gas as the buffer gas is supplied to the condensing chamber CC from an Ar tank as a supply source (not shown), via the second purity improving part 24 and the second supply pipe 26. The buffer gas may be supplied only when the debris particle disperses by the irradiation of the plasma PL.

The second purity improving part 24 improves the purity of the Ar gas, particularly removes the hydrocarbon compound included in the Ar gas, and becomes the density of the hydrocarbon compound included in the Ar gas (included in the Ar gas supplied from the second supply pipe) to 300 ppb or less, preferably 30 ppb or less.

The second purity improving part 24 uses, in the present invention, a gas filter that is constituted of an activated carbon that absorbs the few hydrocarbon compound included in the buffer gas as the impurity. Thereby, the density of the hydrocarbon compound included in the buffer gas that passes through the activated carbon becomes about $1/100$ to $1/1000$ of the density of the hydrocarbon compound in the Ar tank as the supply source. However, the second purity improving part 24 is not limited to the gas filter that is constituted of the activated carbon and may be filters, such as a porous metal and a cold trap that have an absorption function to the hydrocarbon compound.

When the second supply pipe 26 is long, the density of the hydrocarbon compound of the buffer gas easily increases by a desorption of the impurity from an inner wall of the pipe etc. Therefore, the second purity improving part 24 is provided near the condensing chamber CC (in other words, near a supply port 26c of the second supply pipe 26) that is supplied the buffer gas and the influence is preferably reduced as much as possible.

The second supply pipe 26 supplies the Ar gas (buffer gas) from the Ar tank (not shown) to the condensing chamber CC via the supply port 26c. The second supply pipe 26 consists of a metal (in the instant embodiment, a stainless steel) to prevent the desorption of the impurity from the inner wall.

Particularly, the second supply pipe 26b between the second purity improving part 24 and the supply port 26c needs to consist of the metal because the second purity improving part 24 cannot remove the desorption hydrocarbon from the inner wall.

Moreover, an impurity removal effect of the second purity improving part 24 has a life and the life becomes short if a gas with bad purity is used. Therefore, the second supply pipe 26a between the Ar tank as the supply source and the second purity improving part 24 preferably consists of the metal.

The EUV light EL reached at the condensing point CP is supplied to an optical system chamber OC that accommodates the optical system 50. The optical system chamber OC is exhausted by a vacuum pumping system and maintains a predetermined degree of vacuum. The optical system 50 includes, for example, a reflective mirror 52 and an optical integrator 54. In the instant embodiment, the EUV light EL is reflected by the reflective mirror 52, incident upon the optical integrator 54 and becomes an uniformly illumination light.

Although the generating chamber GC is exhausted by the vacuum pumping system as above-mentioned, the Xe gas as the plasma generating gas supplied from the first supply pipe 16 exists. The Xe gas passes through the debris filter 30 and flows into the condensing chamber CC. Moreover, the Xe gas and the Ar gas as the buffer gas supplied from the second supply pipe 26 flow into the optical system chamber OC via an aperture AP formed between the condensing chamber CC and the optical system chamber OC described later.

The gas is exhausted in a position (chamber) introduced gas and an inflow of the gas to other position (other chambers) is minimized to prevent an absorption of the EUV light EL by the plasma generating gas and the buffer gas. Therefore, a gas conductance of the aperture (opening) formed in a boundary of each chamber is made small and a differential pumping needs to be executed.

In the differential pumping between the condensing chamber CC and the optical system chamber OC, a pressure of the optical system chamber OC can be set to almost 1/10 to 1/100 of a pressure of the condensing chamber CC by setting the aperture AP to the almost same size as the condensing point CP.

However, the debris filter 30 is provided between the generating chamber GC and the condensing chamber CC and an opening formed by the debris filter 30 becomes large to introduce a lot of the EUV light EL to the condensing mirror 22. Therefore, a pressure reduction between the generating chamber GC and the condensing chamber CC is not so remarkable as the differential pumping between the condensing chamber CC and the optical system chamber OC.

Then, the instant embodiment reduces the density of impurity (hydrocarbon) included in the plasma generating gas and the buffer gas by the first purity improving part 14, the second purity improving part 24, the first supply pipe 16 and the second supply pipe 26. Thereby, when the plasma generating gas and the buffer gas flow into the condensing chamber CC and the optical system chamber OC, the adhesion of the carbon to the optical system can be reduced and prevent a reduction of the reflectance and an occurrence of non-uniformly light intensity.

Referring to experiment data shown in Table 1, a description will be given of effects of the present invention.

Table 1 shows the density of the hydrocarbon compound in the light source chamber LC and a reduction rate of the reflectance of Si/Mo multilayer film sample mirror irradiated by the EUV light EL in conditions A to C. Here, the condition A (the present invention) uses the first and second supply pipes 16 and 26 consisted of stainless steel and uses the gas filter as the first and second purity improving parts 14 and 24. The condition B uses the first and second supply pipes 16 and 26 consisted of stainless steel and does not provide the first and second purity improving parts 14 and 24. The condition C uses the Teflon tube as the first and second supply pipes 16 and 26 of an outside of the light source chamber LC and uses the stainless steel as the first and second supply pipes 16 and 26 of an inside of the light source chamber LC. The condition C does not provide the first and second purity improving parts 14 and 24.

In the conditions A to C, the following is the same. A length of the first supply pipe 16 and second supply pipe 26 is 3.3 m. A flow rate of the plasma generating gas (Xe gas) is 80 sccm. A flow rate of the buffer gas (Ar gas) is 200 sccm. The density of the hydrocarbon compound in the Xe tank is 2 ppm. The density of the hydrocarbon compound in the Ar tank is 500 ppb. The Si/Mo multilayer film sample mirror is provided near the condensing mirror 22 of between the condensing mirror 22 and the condensing point CP. An initial reflectance of the Si/Mo multilayer film sample mirror is 64.2%. A pressure of the light source chamber LC is 0.8 Pa. The density of the hydrocarbon analyzed the gas that flows into the optical system chamber OC from the light source chamber LC by a quadrupole mass spectrometer connected to the optical system chamber OC. The condition analyzed the gas to the light source chamber LC by a gas chromatograph mass spectrometer.

TABLE 1

| Composition | Condition A (present invention) | Condition B | Condition C |
|---|---|---|---|
| Hydrocarbon compound density | 6 ppb | 700 ppb | 6.6 ppm |
| Reflectance reduction Rate of sample mirror in wavelength of 13.5 nm/ irradiation time | 0.2%/100 hour | 2.6%/10 hour | 19%/10 hour |

Referring to Table 1 the present invention (condition A) remarkably improves the reduction of the reflectance of the Si/Mo multilayer film sample mirror. Since the reduction of the reflectance of the Si/Mo multilayer film sample mirror is mainly caused by the adhesion of the contaminant (carbon), the reduction of the grazing incidence mirror that does not use the multilayer film remarkably improves. In other words, the present invention can reduce the adhesion of the contaminant to the optical element that is provided a reached area of the gas from the light source chamber LC, such as the condensing mirror 22 and the reflective mirror 52 in the optical system 50 (illumination optical system mirror and projection optical system mirror). Thereby, the reduction of the reflectance of the optical element can be remarkably improved.

Particularly, although the adhesion of the contaminant to the optical element in the illumination optical system causes the decrease of the throughput by the reduction of the reflectance, the non-uniformly light intensity by a change of an optical performance, and the decrease of the resolution, the present invention prevents these. The adhesion of the contaminant to the optical element in the projection optical system causes the decrease of the throughput by the reduction of the reflectance. Moreover, although a running cost remarkably increases because the projection optical system is very expensive, the present invention prevents these.

Thus, the present invention can use the optical element in the illumination optical system and the projection optical system for long time, prevent the decrease of the throughput and resolution and provide an economical exposure apparatus that achieves superior exposure performance.

The inventor discovered that almost proportional relationship exists in between the density of the hydrocarbon compound and the reduction rate of the reflectance of the mirror. For example, referring to Table 1, if the EUV light EL is irradiated for 100 hours, it is necessary to control the density of the hydrocarbon compound in the light source chamber to 300 ppb (preferably, 30 ppb) or less to control the reduction rate of the reflectance of the mirror to 10% or less. If the reflectance of the mirror in the illumination optical system reduces, it is necessary to exchange the mirror or clean the mirror. Thereby, it is necessary to stop an operation of the exposure apparatus. Therefore, controlling the hydrocarbon compound in the light source chamber (particularly, the condensing chamber) to 300 ppb or less is a necessary condition for the operation of the exposure apparatus. However, if an operation stop time of the exposure apparatus is long or the cost of the mirror to exchange is expensive, the density of the hydrocarbon compound is controlled to 30 ppb or less and the reduction of the reflectance to the operation of 1000 hours is controlled to 10% or less. The density of the hydrocarbon included in the Xe gas supplied from the light source chamber is preferably controlled to 300 ppb or less to control the density of the hydrocarbon compound in the light source chamber to 300 ppb or less. Moreover, the density of the hydrocarbon included in the Xe gas supplied from the light source chamber is preferably controlled to 30 ppb or less to control the density of the hydrocarbon compound in the light source chamber to 30 ppb or less.

If the pressure of the light source chamber LC can be made low by a exhaust system with large exhaust performance, even if the density of the hydrocarbon compound of the plasma generating gas and the buffer gas is larger than 300 ppb, the reduction of the reflectance can be controlled. However, in actually, the pressure of the light source chamber LC becomes about $1 \times 10^{-1}$ Pa to 10 Pa irrespective of the method of the light source by a generation condition of the plasma PL, a realistic size of the chamber and a restriction of the exhaust system conductance according it. Therefore, a relationship between the density of the hydrocarbon compound and the reduction of the reflectance of the mirror (optical element) hardly changes irrespective of the method of the light source.

In the condensing mirror 22, if the dispersed debris is a lot, a progress of the adhesion of the contaminant becomes slow. However, since the reduction rate of the reflectance of the Mo/Si multilayer film sample mirror in the instant experiment and the reduction rate of the reflectance of the reflective mirror 52 in the optical system 50 are almost the same, the amount of the debris is not an amount that affects the adhesion of the contaminant.

The instant embodiment explained the density of the hydrocarbon compound in the plasma generating gas and the buffer gas that are gas necessary to the emission of the plasma PL. However, the density of the hydrocarbon compound is preferably reduced in a gas that is supplied expect when the plasma PL is emitted (for example, a nitrogen gas used for release of the chamber for a maintenance). Such gas remains in the chamber immediately after beginning to vacuum-exhaust the chamber.

If the light source apparatus 1 is a laser plasma light source, the reduction of the reflectance of the optical element can be similarly improved by controlling the density of the hydrocarbon compound included in the target material and the density of the hydrocarbon compound included in the buffer gas.

Figure 2:
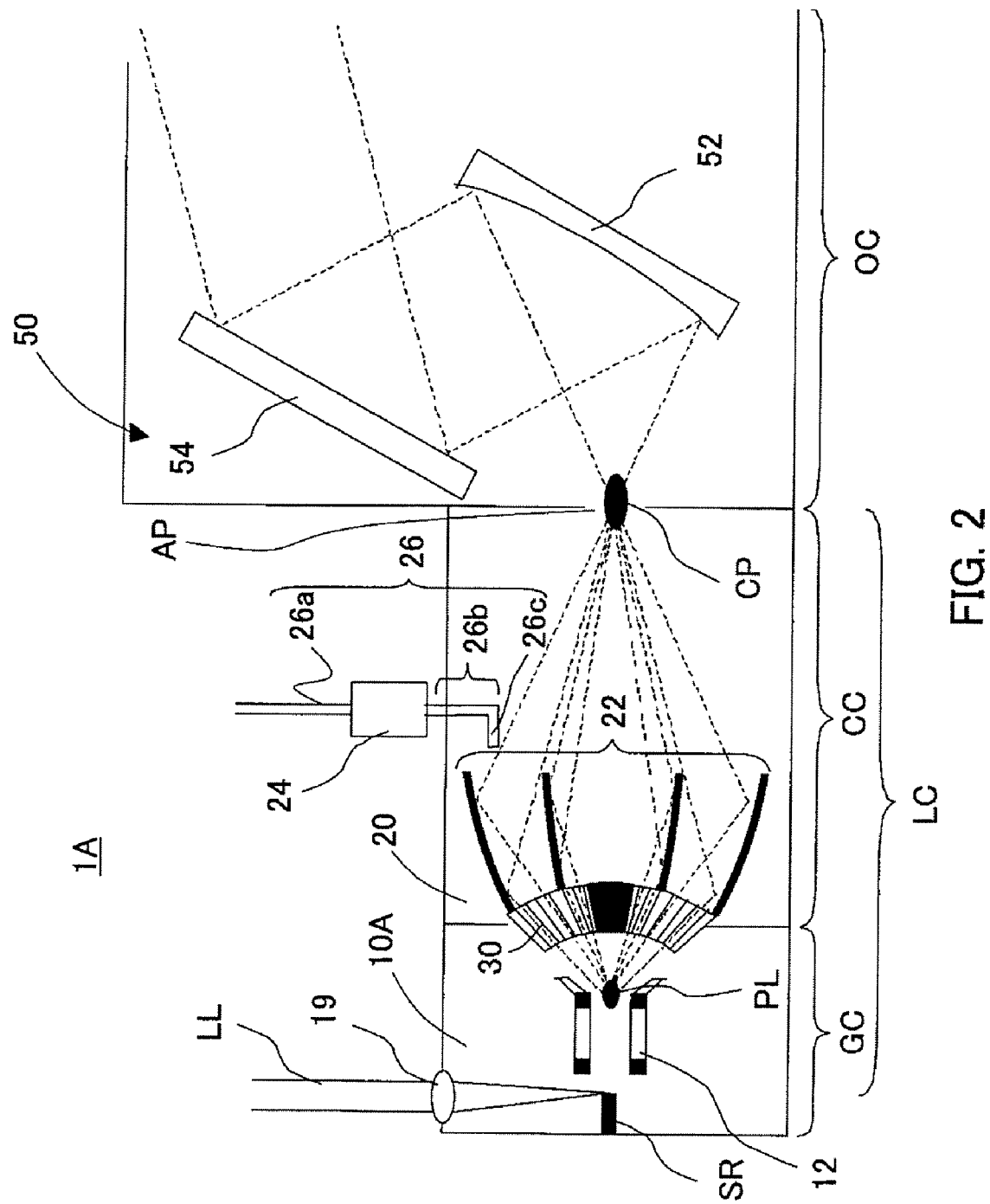
FIG. 2 is a schematic sectional view of a light source apparatus that is variation of the light source apparatus shown in FIG. 1.

Next, referring to FIG. 2, a description will be given of a light source apparatus 1A that is variation of the light source apparatus 1. The light source apparatus 1A is deferent from the light source apparatus 1 in a structure of a plasma generating part 10A. Here, FIG. 2 is a schematic sectional view of the light source apparatus 1A that is variation of the light source apparatus 1 shown in FIG. 1.

The light source apparatus 1A is typically a discharge plasma light source. The plasma generating part 10A evaporates a tin by irradiating a laser beam LL condensed by a condensing lens 19 to a tin rod SR provided in the generating chamber GC, and generates a plasma PL using a tin vapor (working gas) as the plasma generating gas.

The tin rod SR uses a high purity tin. The hydrocarbon is easily separated by a specific gravity difference between the tin and the hydrocarbon in a liquid that is a molten state of a purification process. Therefore, the tin rod SR does not include the hydrocarbon compound. The tin rod SR uses a cleaned tin so that the hydrocarbon compound does not adhere to the surface. Therefore, the hydrocarbon compound does not generate by the evaporation of the tin.

On the other hand, the Ar gas as the buffer gas is similar to the light source apparatus 1 and the density of the hydrocarbon compound becomes 30 ppb or less by the second purity improving part 24 and the second supply pipe 26.

Thus, the light source apparatus 1A can prevent the reduction of the reflectance of the optical element and the non-uniformly light intensity, prevents the decrease of the throughput and the resolution, and can provide an economical exposure apparatus that achieves superior exposure performance.

Figure 3:
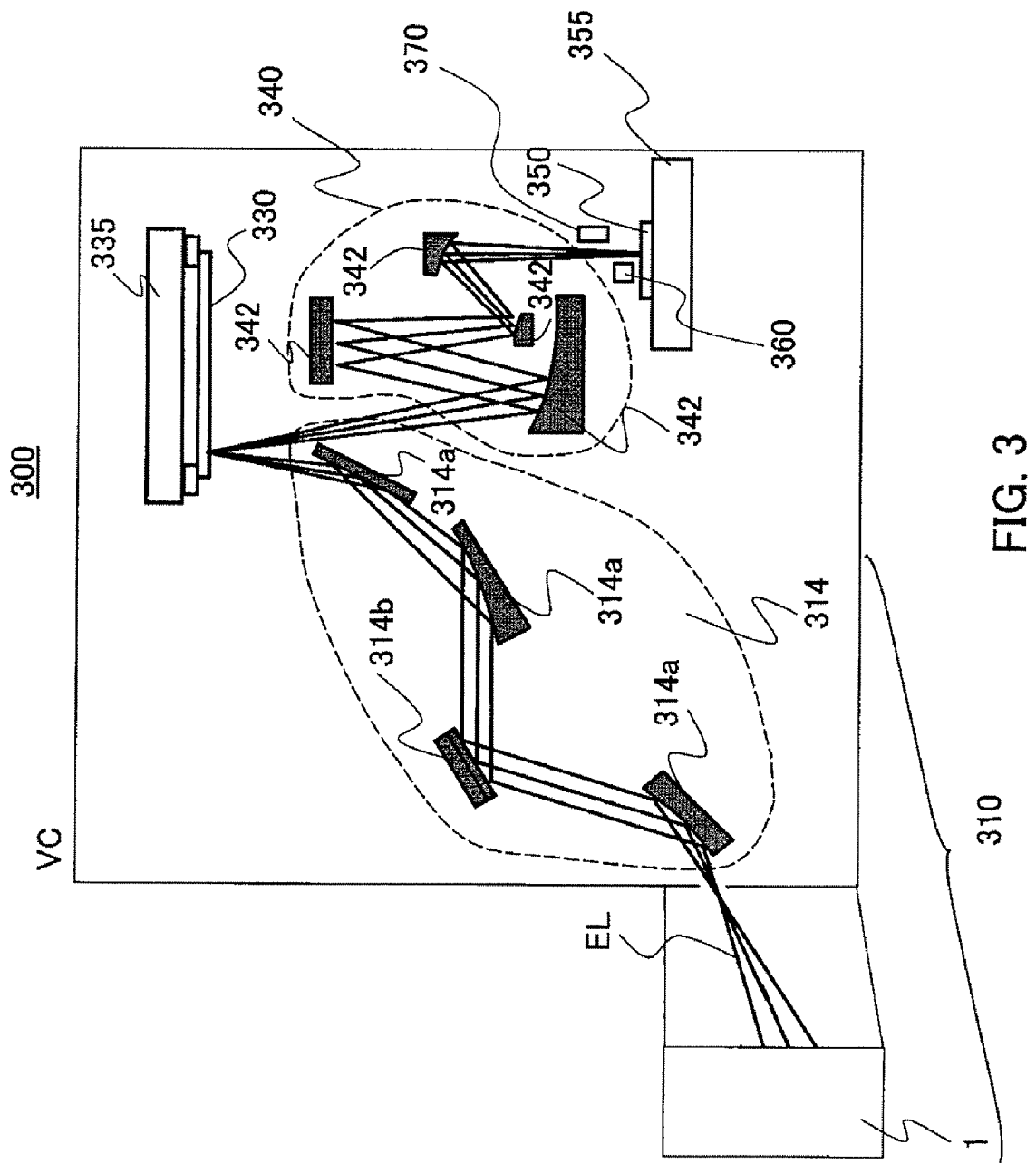
FIG. 3 is a schematic sectional view of an exposure apparatus of one aspect according to the present invention.

Referring to FIG. 3, a description will be given of an exemplary exposure apparatus 300 that applies the light source apparatus 1 or 1A. Here, FIG. 3 is a schematic sectional view of the exposure apparatus 300 according to one aspect of the present invention.

The inventive exposure apparatus 300 uses the EUV light (with a wavelength of, e.g., 13.4 nm) as illumination light for exposure, and exposes onto a plane 340 a circuit pattern of a mask 320, for example, in a step-and-scan manner or step-and-repeat manner. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 3, the exposure apparatus 300 includes an illumination apparatus 310, a mask stage 335 mounted with the mask 330, a projection optical system 340, a wafer stage 355 mounted with the plate 350, an alignment detecting mechanism 360, and a focus position detecting mechanism 370.

As shown in FIG. 3, at least the optical path through which the EUV light travels (or the entire optical system) should preferably be maintained in a vacuum chamber VC, since the EUV light has low transmittance to the air and causes contaminations as a result of response to components of residual gas (or polymer organic gas).

The illumination apparatus 310 illuminates the mask 330 using the EUV light that has a wavelength of, for example, 13.4 nm and an arc shape corresponding to an arc-shaped field of the projection optical system 340, and includes the light source apparatus 1 and an illumination optical system 314.

Any structure as described above is applicable to the light source apparatus 1, and a detailed description thereof is omitted. While FIG. 3 uses the light source apparatus 1 shown in FIG. 1, such a structure is exemplary, and the present invention is not limited to this. For example, the light source apparatus 1A shown in FIG. 2 may be used.

The illumination optical system 314 includes a reflective mirror 314a and an optical integrator 314b. The reflective mirror 314a reflects the EUV light EL supplied from the light source apparatus 1 and introduce the EUV light EL to a subsequent optical element (optical system). The optical integrator 314b uniformly illuminates the mask 330 with a predetermined aperture. The illumination optical system 314 further includes an aperture at a position conjugate with the mask 330, which limits an illumination area of the mask 330 to an arc shape.

The mask 330 is a reflection mask, and has a circuit pattern (or image) to be transferred. The mask 330 is supported and driven by the mask stage 335. The diffracted light emitted from the mask 330 is projected onto the plate 350 after reflected by the projection optical system 340. The mask 330 and the plate 350 are arranged optically conjugate with each other. Since the exposure apparatus 300 is a scanner, the mask 330 and plate 350 are scanned to transfer a reduced size of a pattern of the mask 330 onto the plate 350.

The mask stage 335 supports the mask 330 and is connected to a moving mechanism (not shown). The mask stage 335 may use any structure known in the art. The moving mechanism (not shown) may includes a linear motor etc., and drives the mask stage 335 at least in a direction X and moves the mask 330. The exposure apparatus 300 synchronously scans the mask 330 and the plate 350. Here, X is a scan direction on the mask 330 or the plate 350, Y is a direction perpendicular to it, and Z is a perpendicular direction on the surface of mask 330 or the plate 350.

The projection optical system 340 uses plural reflective mirrors (multilayer mirrors) 342 to project a reduce size of a pattern of the mask 330 onto the plate 350. The number of reflective mirrors 342 is about four to six. For wide exposure area with the small number of mirrors, the mask 330 and plate 350 are simultaneously scanned to transfer a wide area that is an arc-shape area or ring field apart from the optical axis by a predetermined distance. The projection optical system 340 has a NA of about 0.2 to 0.3.

The instant embodiment uses a wafer as the plate 350 to be exposed, but it may include a spherical semiconductor and liquid crystal plate and a wide range of other plates to be exposed. Photoresist is applied onto the plate 350.

The wafer stage 355 supports the plate 350 via a wafer chuck. The wafer stage 355 moves the plate 350, for example, using a linear motor in XYZ directions. The mask 330 and the plate 350 are synchronously scanned. The positions of the mask stage 335 and wafer stage 355 are monitored, for example, by a laser interferometer, and driven at a constant speed ratio.

The alignment detecting mechanism 360 measures a positional relationship between the position of the mask 330 and the optical axis of the projection optical system 340, and a positional relationship between the position of the plate 350 and the optical axis of the projection optical system 340, and sets positions and angles of the mask stage 335 and the wafer stage 355 so that a projected image of the mask 330 may accord with the plate 350.

The focus position detecting mechanism 370 measures a focus position on the plate 350 surface, and controls over a position and angle of the wafer stage 355 always maintains the plate 350 surface at an imaging position of the projection optical system 340 during exposure.

In exposure, the EUV light EL emitted from the illumination apparatus 310 illuminates the mask 330, and images a pattern of the mask 330 onto the plate 350 surface. The instant embodiment uses an arc or ring shaped image plane, scans the mask 330 and plate 350 at a speed ratio corresponding to a reduction rate to expose the entire surface of the mask 330. The light source apparatus 1 in the illumination apparatus 310 used for the exposure apparatus 300 can prevent the reduction of the reflectance and non-uniformly light intensity of the optical element in the illumination optical system and the projection optical system. Therefore, the exposure apparatus 300 can provide devices (such as semiconductor devices, LCD devices, image pickup devices (e.g., CCDs), and thin film magnetic heads) with a high throughput and good economical efficiency.

Figure 4:
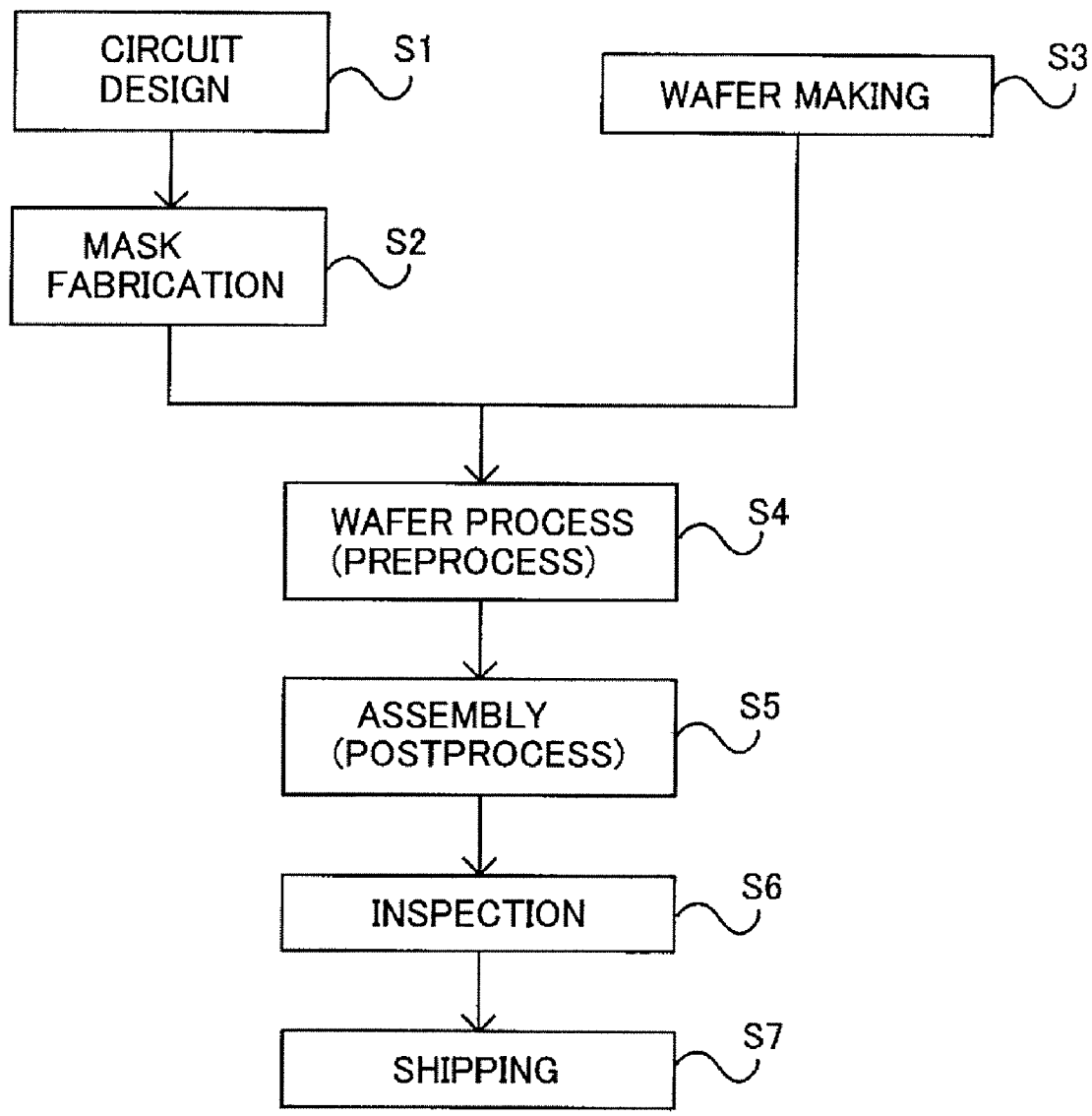
FIG. 4 is a flowchart for explaining a method for fabricating devices (semiconductor chips such as ICs, LSIs, and the like, LCDs, CCDs, etc.).
Figure 5:
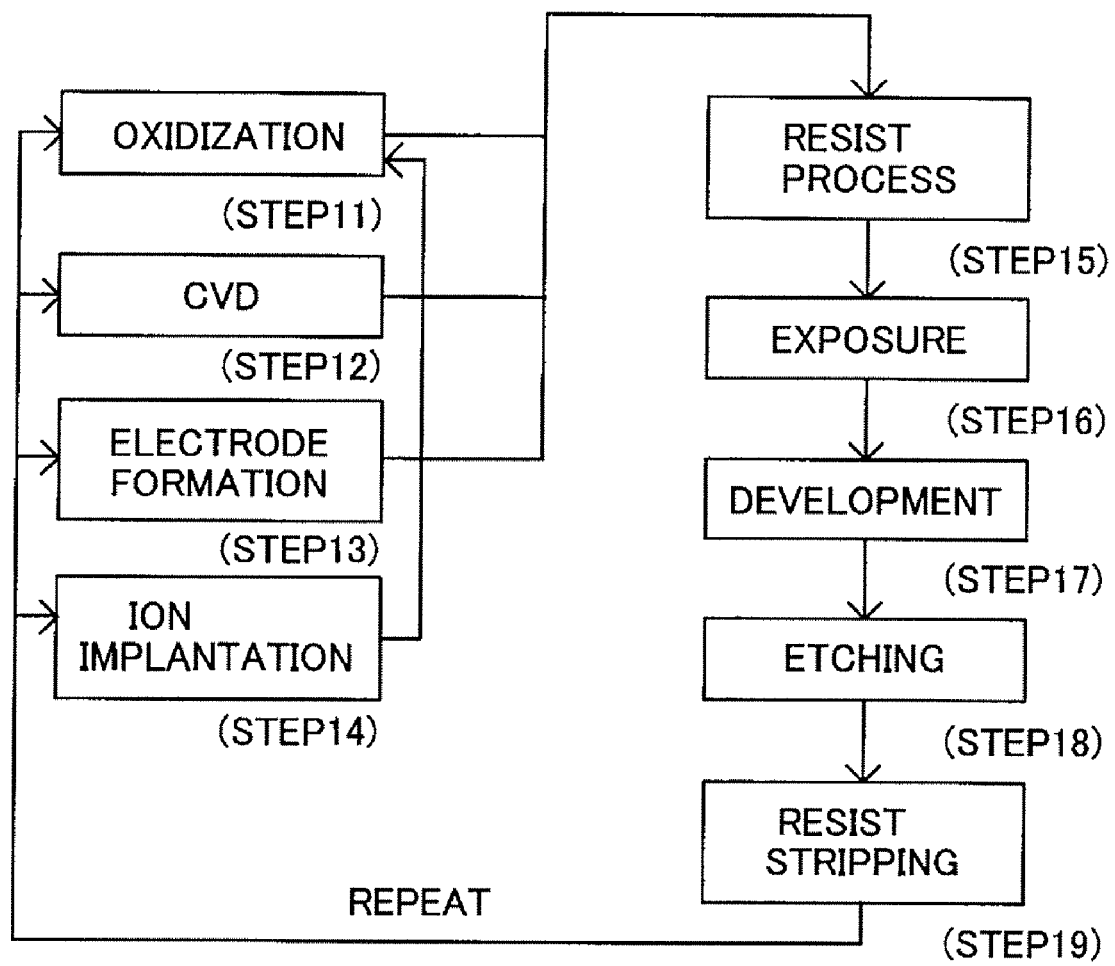
FIG. 5 is a detail flowchart of a wafer process in Step 4 of FIG. 4.

Referring now to FIGS. 4 and 5, a description will be given of an embodiment of a device fabrication method using the above mentioned exposure apparatus 300. FIG. 4 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 300 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 300, and resultant devices constitute one aspect of the present invention.

Furthermore, the present invention is not limited to these preferred embodiments and various variations and modifications may be made without departing from the scope of the present invention.

This application claims a foreign priority benefit based on Japanese Patent Application No. 2005-200764, filed on Jul. 8, 2005, which is hereby incorporated by reference herein in its entirety as if fully set forth herein.

What is claimed is:

1. A light source apparatus for generating a plasma and supplying a light irradiated from the plasma to an optical system, said light source apparatus comprising:
    a first supply pipe for supplying a plasma generating gas to generate the plasma; and
    a first gas filter, provided to the first supply pipe, for reducing a density of a hydrocarbon compound in the plasma generating gas
    wherein said first supply pipe consists of metal at least between the first filter and a supply port that supplies the plasma generating gas.

2. A light source apparatus according to claim 1, further comprising:
    a second supply pipe for supplying a buffer gas that prevents a reach of debris generated from the plasma to the optical system; and
    a second gas filter, provided to the second supply pipe, for reducing a density of a hydrocarbon compound included in the buffer gas,
    wherein said second supply pipe consists of metal at least between the second gas filter and a supply port that supplies the buffer gas.

3. A light source apparatus according to claim 1, wherein said first gas filter is configured to reduce a density of a hydrocarbon compound included in the plasma generating gas to 300 ppb or less.

4. A light source apparatus according to claim 2, wherein said second gas filter is configured to reduce a density of a hydrocarbon compound included in the buffer gas to 300 ppb or less.

5. A light source apparatus according to claim 1, wherein said first gas filter is provided at a side of a supply port that supplies the plasma generating gas rather than a side of a supply source of the plasma generating gas.

6. A light source apparatus according to claim 2, wherein said second gas filter is provided at a side of a supply port that supplies the buffer gas rather than a side of a supply source of the buffer gas.

7. An exposure apparatus comprising:
    a light source apparatus according to claim 1;
    an illumination system for illuminating a pattern of a mask using a light from the light source; and
    a projection system for projecting the pattern onto a plate.

8. A device fabrication method comprising the steps of:
    exposing a plate using an exposure apparatus according to claim 7; and
    performing a development process for the plate exposed.

9. A light source apparatus according to claim 1, wherein said first supply pipe consists of metal between the first gas filter and a supply source of the plasma generating gas.

10. A light source apparatus according to claim 2, wherein said second supply pipe consists of metal between the second gas filter and a supply source of the buffer gas.

11. A light source apparatus according to claim 1, further comprising:
    a generating chamber where the plasma is generated;
        a condensing chamber where the light irradiated from the plasma is converged;
        a debris filter provided between the generating chamber and the condensing chamber for catching the debris generated from the plasma or members near the plasma;
        a condensing part provided in the condensing chamber for converging the light generated from the plasma and passed through the debris filter;
        wherein the supply port of the first supply pipe is provided in the generating chamber, and the supply port of the second pipe is provided in the condensing chamber.

* * * * *